(12) United States Patent
Pöllänen et al.

(10) Patent No.: US 6,289,205 B1
(45) Date of Patent: *Sep. 11, 2001

(54) TRANSMITTER FOR COMMUNICATION DEVICES

(75) Inventors: Ossi Pöllänen, Veikkola; Esko Järvinen, Espoo, both of (FI)

(73) Assignee: Nokia Mobile Phones Limited, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,752

(22) Filed: Dec. 30, 1997

(30) Foreign Application Priority Data

Jan. 3, 1997 (FI) .......................................................... 970024

(51) Int. Cl.⁷ .................................................... H04B 1/04
(52) U.S. Cl. .......................... 455/126; 455/127; 455/116; 330/129; 330/279
(58) Field of Search ............................. 455/91, 115, 116, 455/126, 127, 239.1, 240.1, 252.1, 117, 234, 245; 330/129, 140, 279, 139, 278, 285, 138

(56) References Cited

U.S. PATENT DOCUMENTS

| | | | |
|---|---|---|---|
| 4,312,032 | 1/1982 | Kirby | 363/97 |
| 4,602,218 | * 7/1986 | Vilmur et al. | 330/279 |
| 4,631,491 | * 12/1986 | Smithers | 330/149 |
| 4,994,757 | * 2/1991 | Bickley et al. | 330/285 |
| 5,101,175 | 3/1992 | Vaisanen | 330/279 |
| 5,109,538 | 4/1992 | Ikonen et al. | 455/89 |
| 5,118,965 | 6/1992 | Vaisanen et al. | 307/261 |
| 5,119,506 | * 6/1992 | McGann | 455/116 |

(List continued on next page.)

FOREIGN PATENT DOCUMENTS

| | | |
|---|---|---|
| 0544193 A1 | 6/1993 | (EP) . |
| 0 679 041 A2 | 4/1995 | (EP) . |
| 2 301 964 A | 12/1996 | (GB) . |

OTHER PUBLICATIONS

European Search Report dated Dec. 8, 2000, 3 pages.
Patent Abstracts of Japan, publication No. 04350573, publication date: Apr. 12, 1992.

Primary Examiner—Daniel Hunter
Assistant Examiner—Pablo Tran
(74) Attorney, Agent, or Firm—Perman & Green, LLP

(57) ABSTRACT

A transmitter (2) for communication devices according to the invention comprises a high-frequency power amplifier for amplifying the high-frequency signal to be transmitted, which high-frequency power amplifier includes an output stage for giving an amplified high-frequency signal, and measuring devices for measuring the power ($P_{dc}$) of the high-frequency signal. The measuring devices comprise devices (A1, RECT1, INT1, A2, RECT2, INT2) for measuring the voltage ($V_{CE}$) and current ($I_E$) of the high-frequency signal in said output stage, and means (M1, INT3) for calculating the power of the high-frequency signal on the basis of the measured high-frequency voltage ($V_{meas}$) and high-frequency current ($I_{meas}$). A mobile station (1) according to the invention has a transmitter (2) for transmitting signals, which transmitter (2) includes a high-frequency power amplifier for amplifying the high-frequency signal to be transmitted. The high-frequency power amplifier includes an output stage (4) for giving an amplified high-frequency signal, and measuring devices for measuring the power ($P_{dc}$) of the high-frequency signal. The measuring devices comprise devices (A1, RECT1, INT1, A2, RECT2, INT2) for measuring the voltage ($V_{CE}$) and current ($I_E$) in said output stage (4), and means (M1, INT3) for calculating the power of the high-frequency signal on the basis of the measured high-frequency voltage ($V_{meas}$) and high-frequency current ($I_{meas}$).

13 Claims, 14 Drawing Sheets

U.S. PATENT DOCUMENTS

| | | | | |
|---|---|---|---|---|
| 5,128,629 | * | 7/1992 | Trinh | 330/129 |
| 5,152,004 | | 9/1992 | Vaisanen et al. | 455/68 |
| 5,182,527 | * | 1/1993 | Nakanishi et al. | 330/285 |
| 5,196,806 | * | 3/1993 | Ichihara | 330/137 |
| 5,204,643 | | 4/1993 | Verronen | 333/81 R |
| 5,214,372 | | 5/1993 | Vaisanen et al. | 324/95 |
| 5,230,091 | | 7/1993 | Vaisanen | 455/88 |
| 5,239,696 | * | 8/1993 | Blach et al. | 455/127 |
| 5,241,694 | | 8/1993 | Vaisanen et al. | 455/126 |
| 5,276,917 | | 1/1994 | Vanhanen et al. | 455/89 |
| 5,291,150 | * | 3/1994 | Saarnimo et al. | 330/279 |
| 5,392,464 | | 2/1995 | Pakonen | 455/115 |
| 5,404,585 | | 4/1995 | Vimpari et al. | 455/115 |
| 5,412,341 | * | 5/1995 | Walczak | 330/138 |
| 5,423,074 | * | 6/1995 | Dent | 455/74 |
| 5,426,641 | | 6/1995 | Afrashteh et al. | 370/95.3 |
| 5,432,473 | | 7/1995 | Mattila et al. | 330/133 |
| 5,434,537 | | 7/1995 | Kukkonen | 330/2 |
| 5,493,255 | | 2/1996 | Murtojarvi | 330/296 |
| 5,497,125 | | 3/1996 | Royds | 330/290 |
| 5,530,923 | | 6/1996 | Heinonen et al. | 455/126 |
| 5,548,616 | | 8/1996 | Mucke et al. | 375/295 |
| 5,564,074 | | 10/1996 | Juntti | 455/67.1 |
| 5,613,229 | * | 3/1997 | Baranowski et al. | 455/127 |
| 5,652,542 | | 7/1997 | Fink | 330/2 |
| 5,652,547 | * | 7/1997 | Mokhtar et al. | 330/279 |
| 5,675,611 | | 10/1997 | Lehtinen et al. | 375/297 |
| 5,697,074 | | 12/1997 | Makikallio et al. | 455/126 |
| 5,905,407 | * | 1/1993 | Midya | 330/10 |

* cited by examiner

TRANSMITTER FOR COMMUNICATION DEVICES

BACKGROUND OF THE INVENTION

1. Field of the Invention

This invention relates to a transmitter for communication devices as presented in the preamble of claim 1 and to a mobile station as presented in the preamble of claim 9.

2. Description of the Prior Art

The transmitters of communication devices have a high frequency power amplifier, in which the signal to be transmitted is amplified. The output of the high frequency power amplifier is connected to the adapter circuit of the antenna, in which circuit the impedance of the antenna is adapted to the output impedance of the high frequency power amplifier. The purpose of the adaption is, among other things, to prevent the formation of reflection waves from the antenna towards the high frequency power amplifier. However, high frequency power amplifiers are sensitive to load variations. Load variations cause distortion in the signal to be amplified, among other things. It is also possible that the high frequency power amplifier is damaged in difficult load conditions. In portable communication devices, in particular, the load variations of high frequency power amplifiers are due to the interaction between the antenna and the operation environment and changes in operating conditions. Metal objects in the vicinity of the antenna, for example, can remarkably change the antenna impedance of the portable communication device. This, in turn, has an effect on the operation point of the last stage of the high frequency power amplifier, whereby the transistor is exposed to large voltage and current variations. In time, these voltage and current variations can impair the performance of the output stage transistor of the high frequency power amplifier, and possibly also shorten its lifetime.

There are prior art solutions, in which the power signal formed by the high frequency power amplifier is measured by means of a directional coupler and a detector diode. For example, FIG. 1 shows a prior art coupling, in which the directional coupler DIR1 samples the power fed to the output. The samples are detected by a detector diode D1. A method like this, based on a directional coupler, operates well when the load impedance Z is constant. However, the method provides incorrect information in situations in which the load impedance varies, as usually happens when portable communication devices are used. In order to indicate this, the operation of the coupling in FIG. 1 has been simulated. The simulation results can be seen in FIGS. 2a–2e. In this simulation, a bipolar transistor biased into the class AB was used as the power transistor T1 of the output stage, and a harmonic trap was used to form the harmonics. Samples of the output power were taken by a directional coupler DIR1, and the samples were detected with a detector diode D1. The detector diode D1 was biased to the linear region of operation, whereby the output power is proportional to the square of the voltage $V_{meas}$ formed by the detector diode D1.

Load variations are common in portable communication devices, such as mobile stations, because the interaction between the environment and the antenna cause load variations in the high frequency power amplifier. Table 1 shows various impedance values used in the simulation. In the first simulation, the value of the load impedance Z was such that it resulted in an optimum resistive load for the simulated amplifier. Different values of the load impedance Z were used in other simulations, resulting in an incorrect adaptation. The values used correspond to a reflection loss of −6 dB to a 6 ohmn load. Simulation results with different values of load impedance are shown in FIGS. 2a–2e. The power measurement was calibrated to produce the correct power reading with an output power of two watts. FIGS. 2a–2e show both the square of the voltage $V_{meas}$ formed by the detector diode D1 and the output power $P_{out}$ of the amplifier in different load situations.

TABLE 1

| Simulation no. | Value of the load impedance Z |
|---|---|
| 1 | 6 Ω |
| 2 | 2 Ω |
| 3 | 18 Ω |
| 4 | 3.6 + j4.8 Ω |
| 5 | 3.6 − j4.8 Ω |

It can be seen from FIG. 2a that the power measurement gives an accurate result in optimum load conditions. It can further be seen from FIGS. 2b–2e that when the load of the amplifier varies, the square of the detected voltage is no more the same as the power conveyed to the load, whereby the measurement does not give the correct idea of the load situation of the amplifier.

Still another disadvantage of using a directional coupler is the fact that a directional coupler causes power loss in the signal to be transmitted. In practical applications, the directional coupler is typically implemented by means of conductor traces incorporated directly on the printed circuit board (PCB), whereby the power loss of the directional coupler is typically approx. 0.5 dB. In addition, a directional coupler formed directly on the circuit board takes an unnecessarily large amount of space.

OBJECTS OF THE INVENTION

Measurement of the signal power is used to adjust the output power of high frequency transmitters. It is an object of the present invention to reduce the disadvantages presented above and to achieve a device for adjusting the power in the power amplifier of the transmitter of a communication device, and a mobile station in which the invention can be advantageously applied. The invention is based on the idea that voltage and current are measured at the output stage of the high frequency power amplifier, whereby the load impedance at the output stage can be calculated and the transmission power adjusted accordingly. The transmitter according to the invention is characterized in what is put forth in the characterizing part of claim 1. A mobile station according to the invention is characterized in what is put forth in the characterizing part of claim 9.

SUMMARY OF THE INVENTION

The present invention has many advantages compared to prior art transmitters and mobile stations. Preferably, the high frequency current running through the amplifier and the high frequency voltage at the output of the amplifier are measured, whereby the load impedance can be calculated very accurately and the output stage can be adjusted on the basis of this to the optimum point of operation. The high-frequency current and the high-frequency voltage are measured as close to the output of the last stage as possible, whereby potential transmission line losses and other losses having an effect on the measurement results can be eliminated and the reliability of the measurements improved compared to the measurements of prior art technique. In addition, it is possible to find out the real load during the transmission, which has an effect on the transistor of the output stage, and thereby to improve the adjustment of the optimum point of operation of the transistor in varying operating conditions. The efficiency of the transmitter according to the present invention is improved as compared to the prior art transmitters, because the measurement of high-frequency current and voltage does not cause a substantial power loss in the output signal. Due to better efficiency, the output power of the transmitter can be somewhat reduced. The measurement coupling can also be implemented in a small space by integrating it to the same semiconductor chip as the power transistor of the output stage of the power amplifier. Space is also saved on the circuit board, and the size of communication devices can be reduced. Potential variations of the load impedance are also taken into account in the measurements according to the invention, which also increases the reliability of the measurement.

BRIEF DESCRIPTION OF THE DRAWINGS

In the following, the invention will be described in more detail with reference to the accompanying drawings, in which.

DETAILED DESCRIPTION OF THE PREFERRED EMBODIMENT(S)

Figure 1:
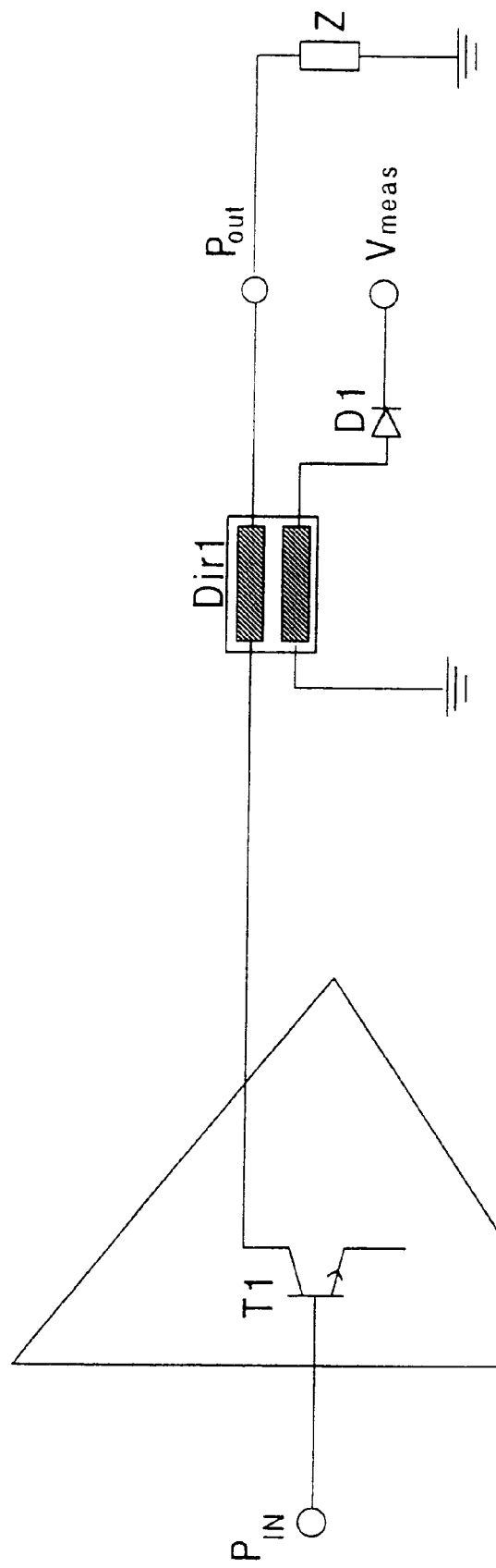
FIG. 1 shows a prior art power measurement.
Figure 2A:
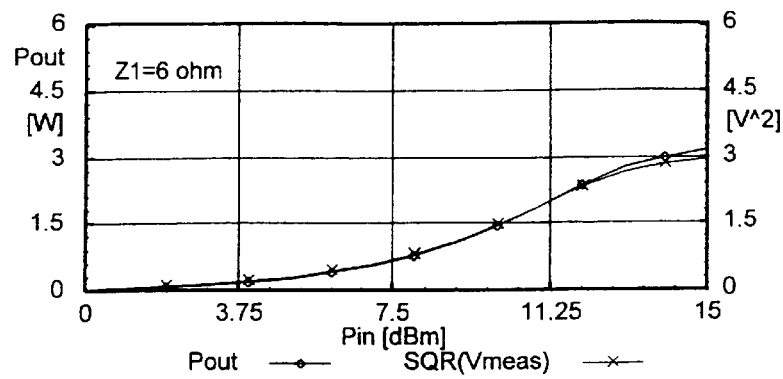
FIGS. 2a–2e show the simulation results of circuit in FIG. 1.
Figure 2B:
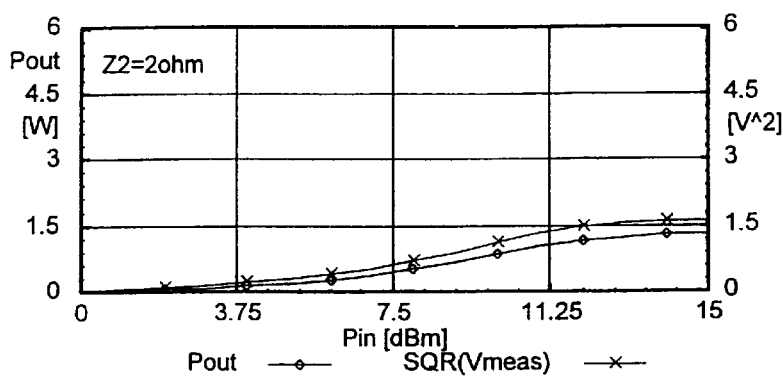
Figure 2C:
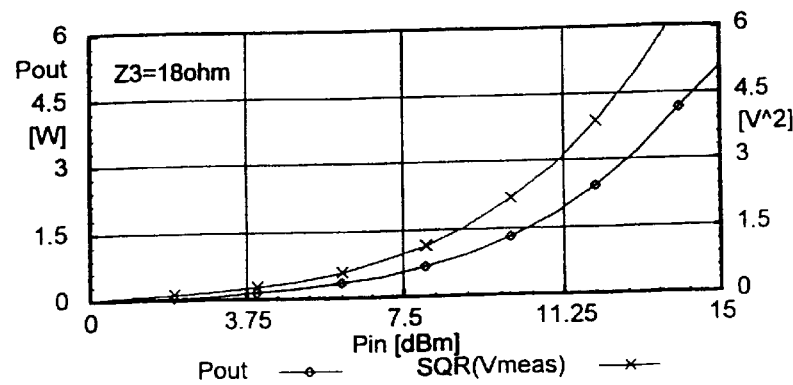
Figure 2D:
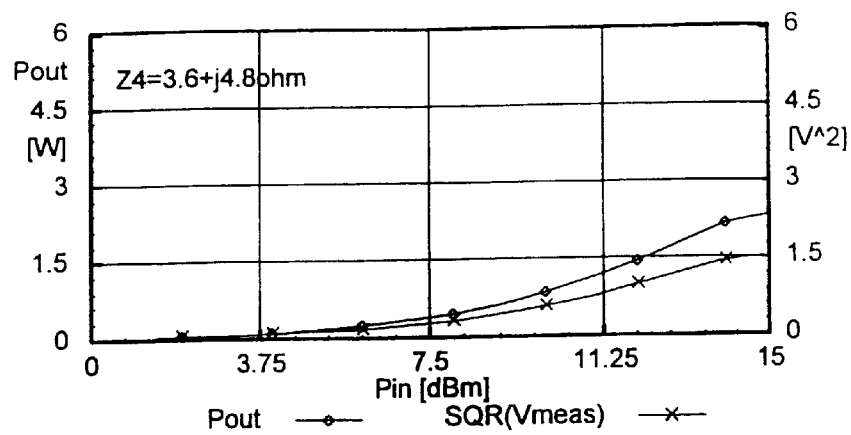
Figure 2E:
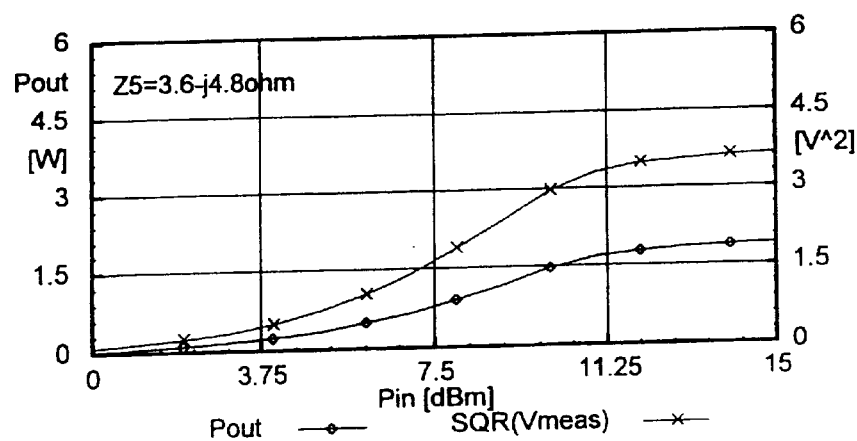
Figure 3:
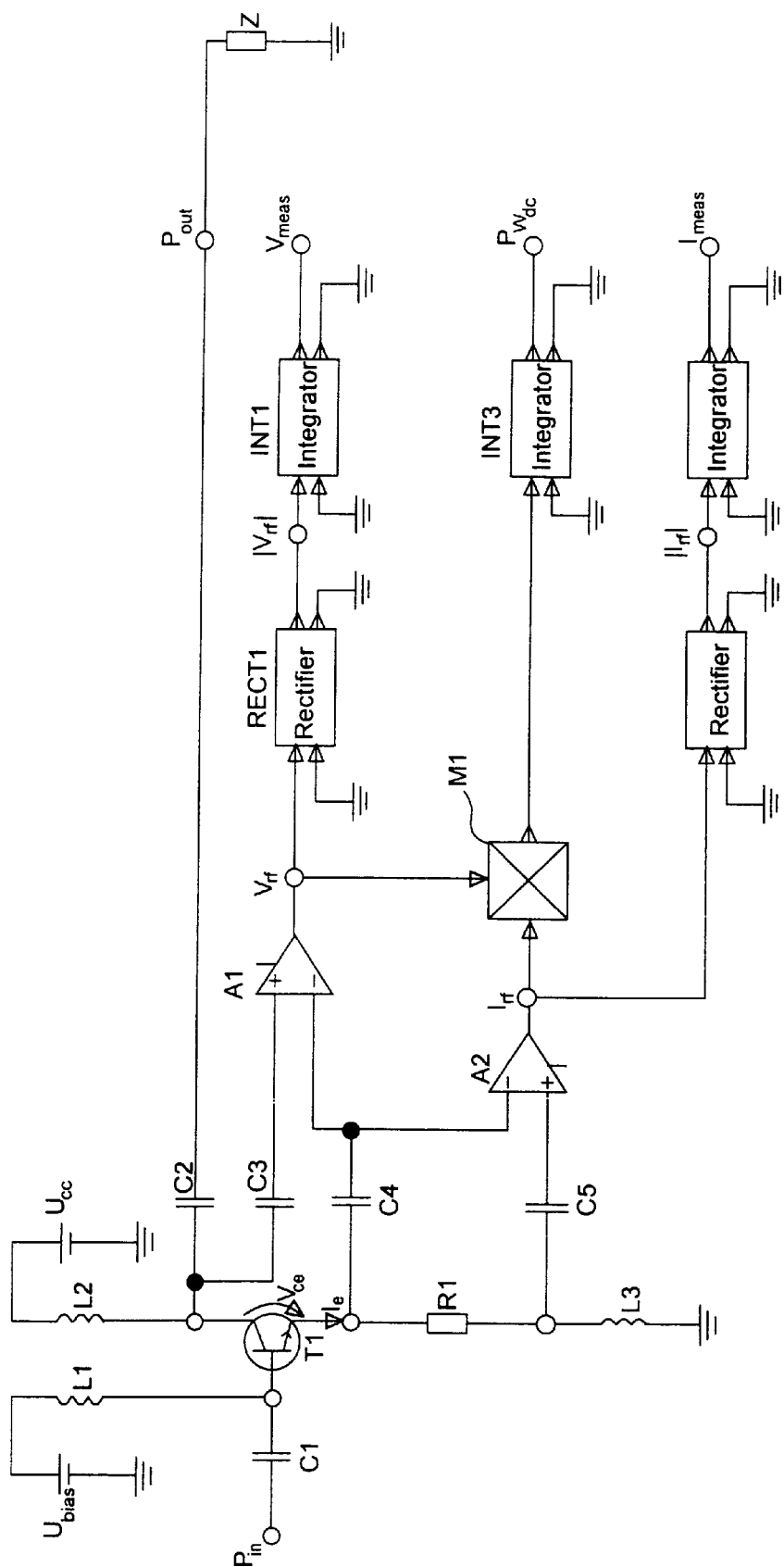
FIG. 3 shows a measurement coupling according to the first embodiment of the invention.
Figure 4A:
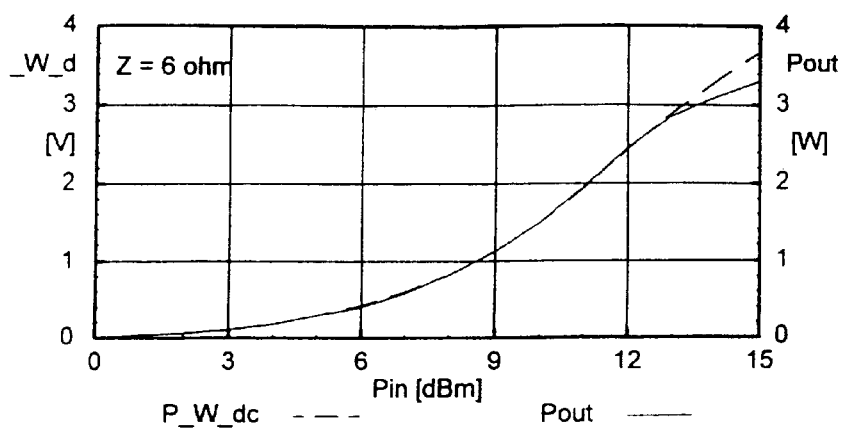
FIGS. 4a–4e show the simulation results of the circuit and calculated output powers for the coupling in FIG. 3 with various load impedances.
Figure 4B:
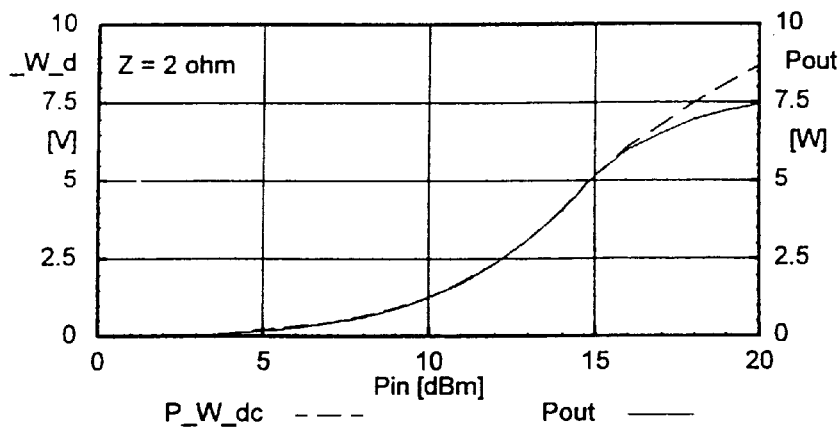
Figure 4C:
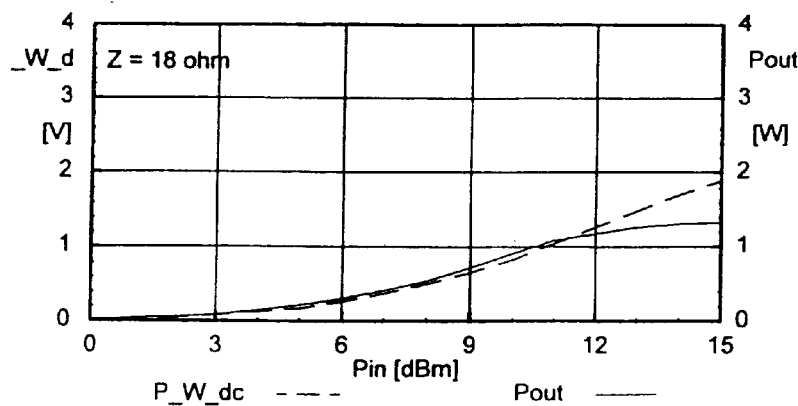
Figure 4D:
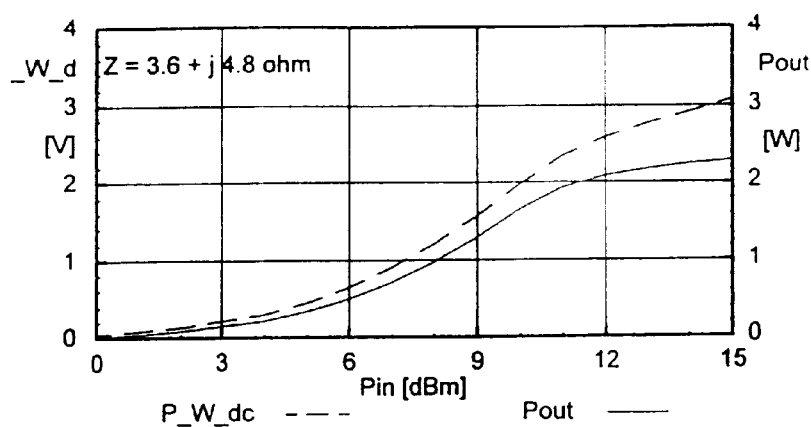
Figure 4E:
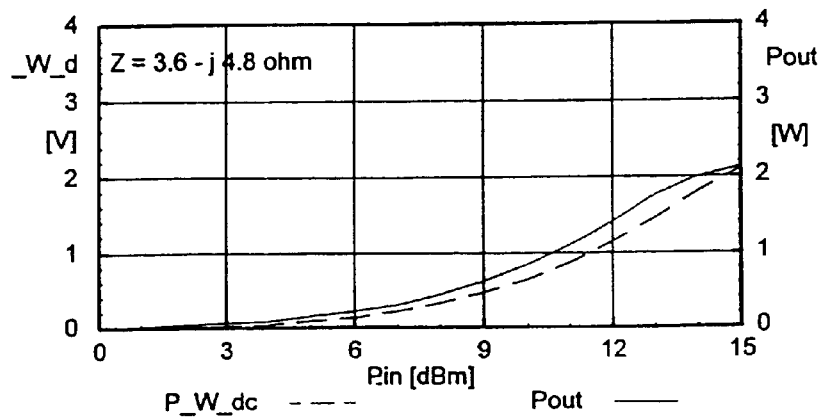
Figure 5A:
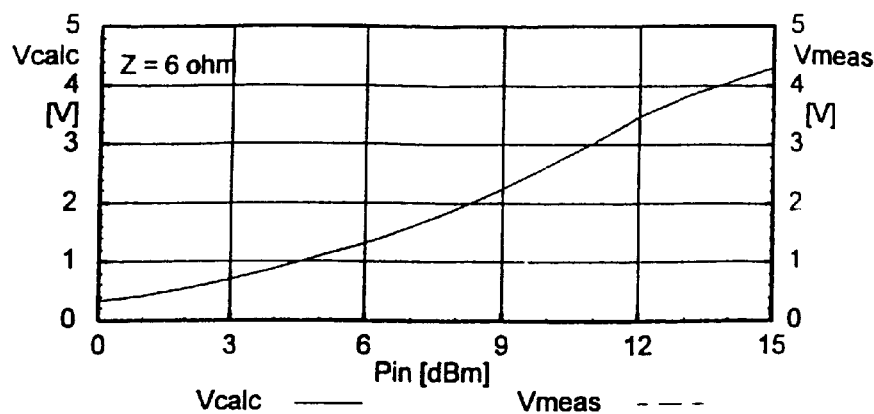
FIGS. 5a–5e show voltages measured and calculated for the coupling in FIG. 3 over the collector-emitter junction with various values of the load impedance.
Figure 5B:
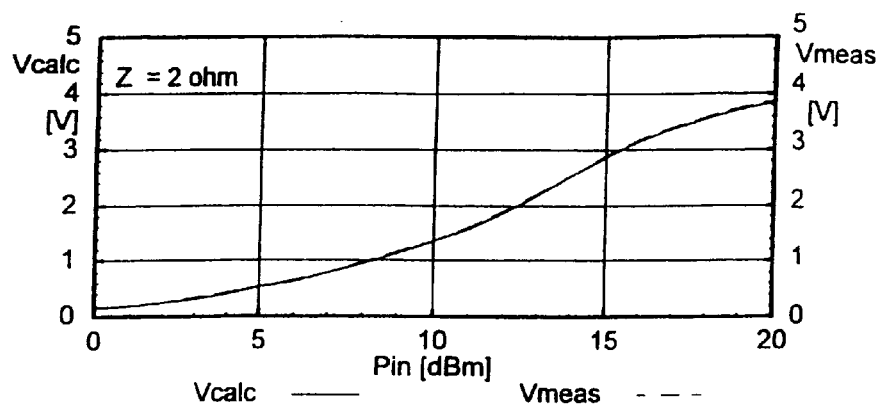
Figure 5C:
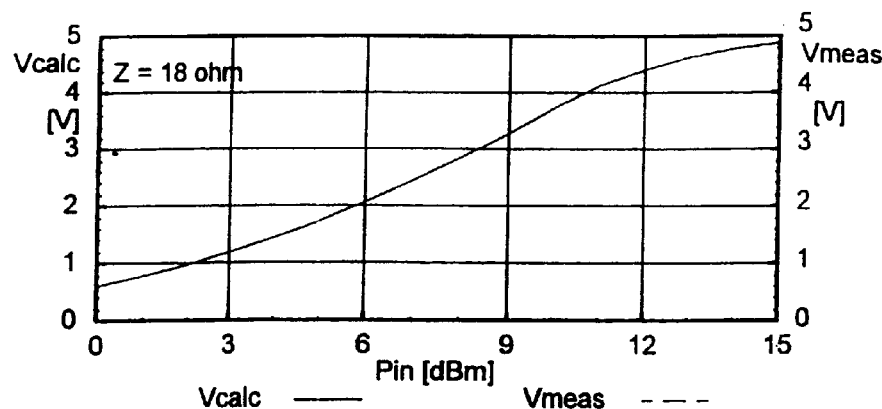
Figure 5D:
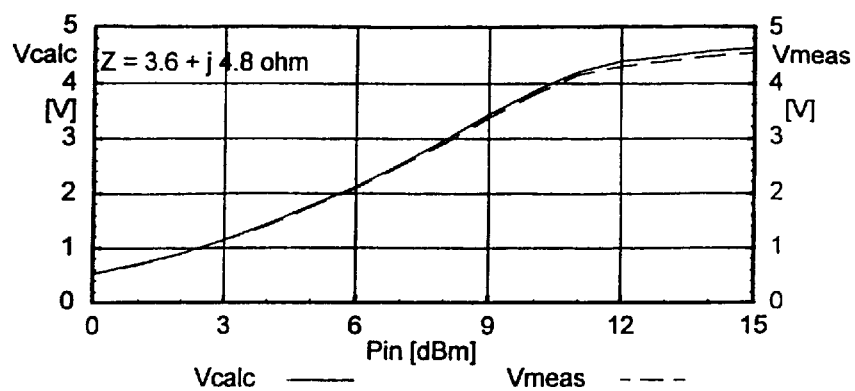
Figure 5E:
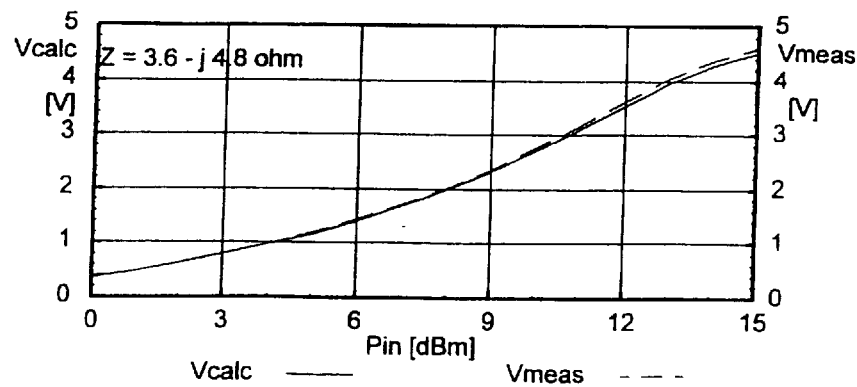
Figure 6A:
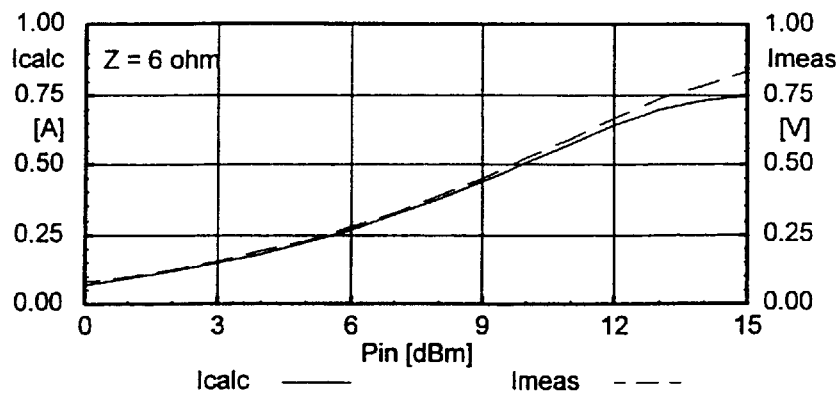
FIGS. 6a–6e show the measured and calculated emitter currents of the transistor with various values of the load impedance.
Figure 6B:
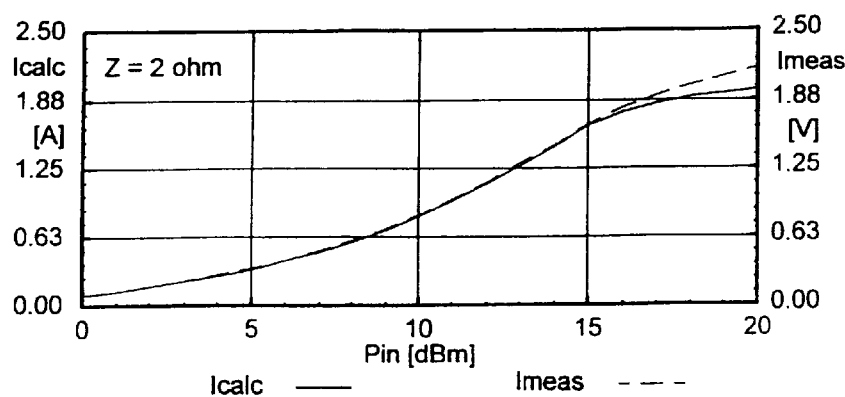
Figure 6C:
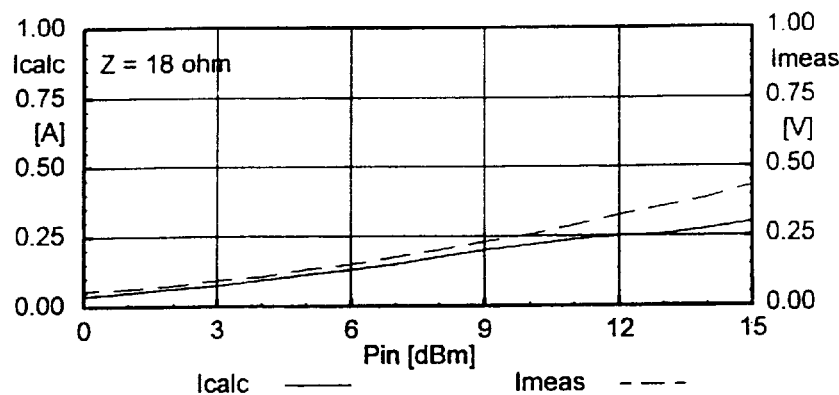
Figure 6D:
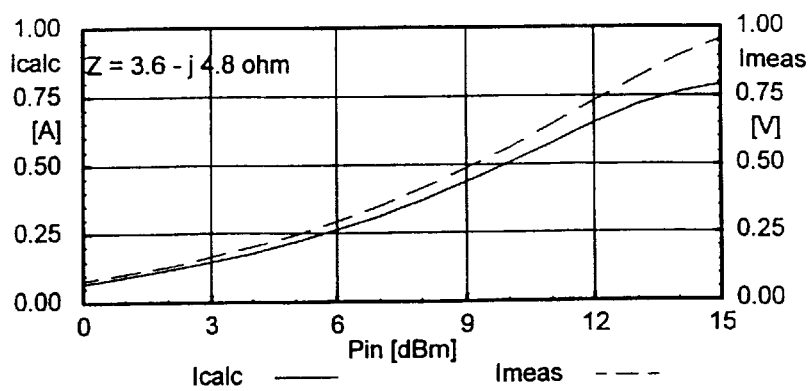
Figure 6E:
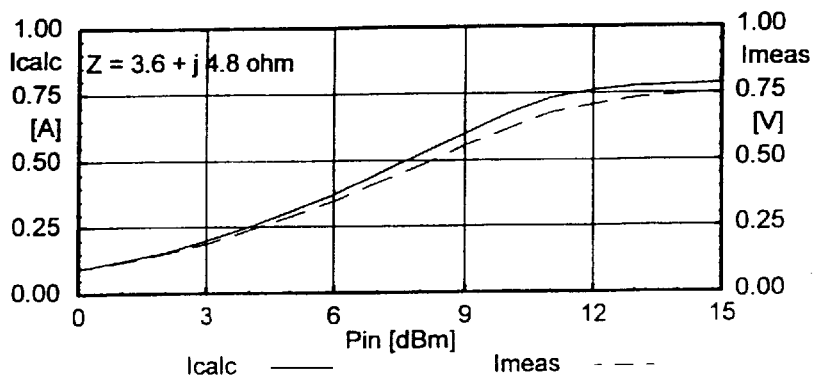
Figure 7A:
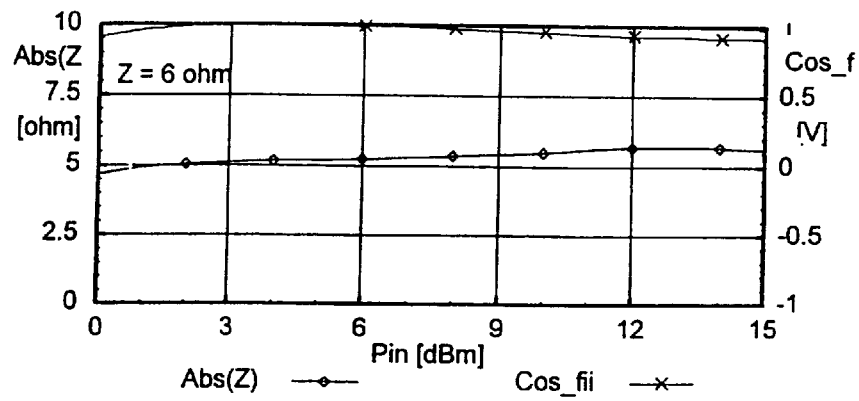
FIGS. 7a–7e show estimation results of the transistor load impedance in the coupling shown in FIG. 3.
Figure 7B:
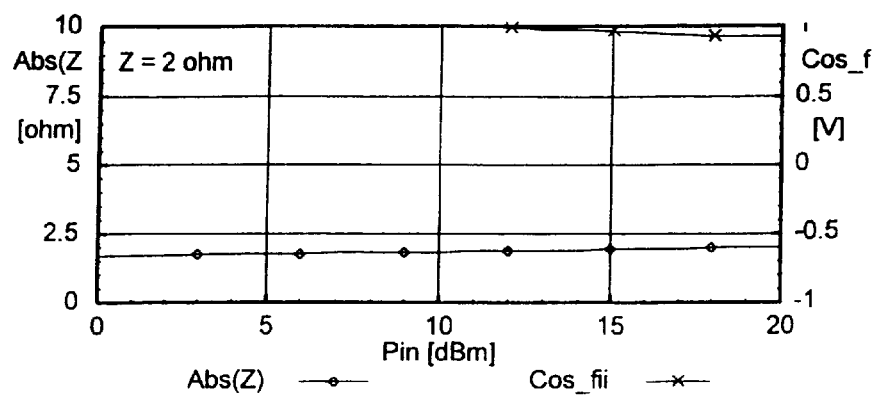
Figure 7C:
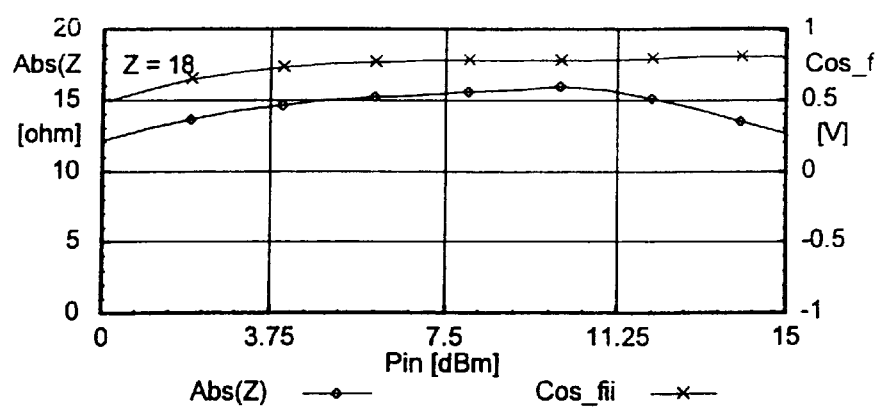
Figure 7D:
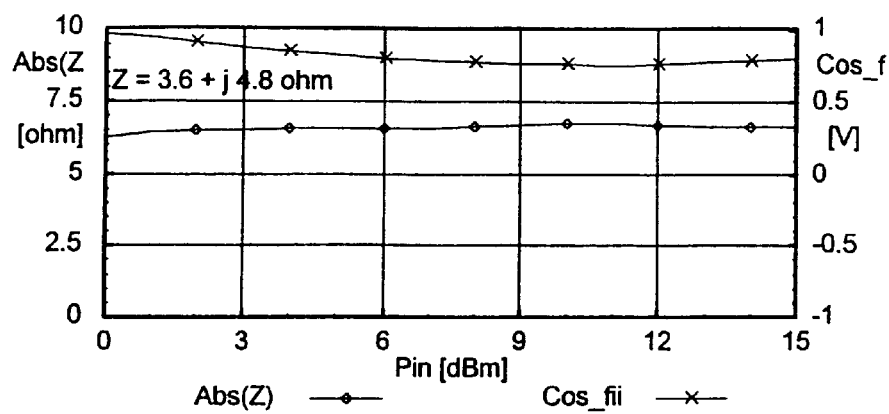
Figure 7E:
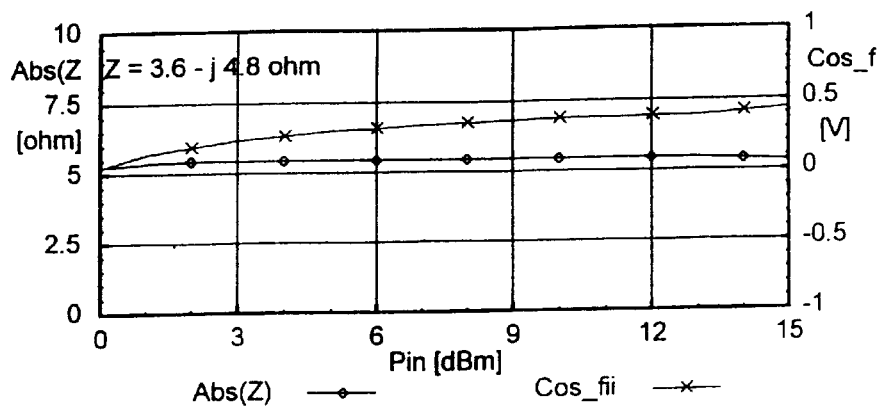

The block diagram of FIG. 3 shows the output stage and measurement circuit of a transmitter according to the first embodiment of the invention. A transistor T1 or other amplifying component can be advantageously used as the amplifying element of the output stage. The high-frequency signal to be transmitted is directed to the pin $P_{in}$. The high-frequency signal is further conveyed through the first capacitor C1 for amplification at the base of the transistor T1 of the output stage. The transistor T1 can be, for example, a bipolar transistor, which has sufficient power capability and high frequency properties in the application used at the time. The point of operation of the transistor T1 is set correct by means of a biasing voltage conveyed to the base of the transistor T1. The biasing voltage is formed by a biasing voltage source $U_{bias}$ and conveyed via the first choke L1. The biasing voltage $U_{bias}$ can be formed with a voltage division coupling implemented with resistors, for example, and it is a technique well known to a person skilled in the art.

The high-frequency signal to be transmitted, directed to the base of the transistor T1, is amplified in the transistor T1, whereby an amplified, high-frequency output signal is received from the collector, which signal is directed via a second capacitor C2 to the load impedance Z. The load impedance Z preferably comprises an antenna and adapting means for achieving an optimum adaptation between the collector circuit and the antenna. In addition, the adapting circuit can comprise a band-pass filter, which is used to attenuate spurious transmissions.

The operating voltage needed by the transistor T1 is directed to the collector of the transistor T1 via a second choke L2.

The emitter circuit of the transistor T1 preferably comprises a resistor R1 and an earth stray inductance L3.

The high-frequency alternating voltage of the collector-emitter junction of the transistor T1 is preferably sensed in a manner such that a voltage signal is directed via a third capacitor C3 to the positive input line of the first differential amplifier A1, and the alternating voltage of the emitter of the transistor T1 is directed via the fourth capacitor C4 to the negative input line of the first differential amplifier A1. Thus a voltage $V_{rf}$ proportional to the high-frequency collector emitter voltage $V_{CE}$ is received from the output of the first differential amplifier A1.

A voltage proportional to the high-frequency emitter current $I_E$ of the transistor T1 can be sensed by differential amplifier A2 through the capacitors C4 and C5.

In the first rectifier RECT1, an absolute value $|V_{rf}|$ is formed from the signal $V_{rf}$ proportional to the voltage, and integrated in the first integrator INT1, resulting in a voltage $V_{meas}$, which is proportional to the mean of the collector-emitter voltage of the transistor T1. The absolute value $|I_{rf}|$ of the voltage $I_{rf}$ proportional to the emitter current is formed in the second rectifier RECT2. The rectified voltage is further integrated in a second integrator INT2, whereby a voltage $I_{meas}$ proportional to the mean value of the emitter current is received from the output of the second integrator.

The real average power of the transistor T1 can be determined by multiplying the voltage by the current value. In the circuit shown in FIG. 3 this has been implemented by directing the output signal of the first differential amplifier A1 and the output signal of the second differential amplifier A2 to the multiplier circuit M1. The multiplier circuit M1 forms a signal proportional to each instantaneous power, which signal is integrated in the third integrator INT3 for forming a voltage $P_{dc}$ proportional to the mean value of the real power.

The measurements according to the invention are formed from signals as near to the power transistor T1 of the output stage as possible, whereby possible transmission line losses and other losses having an effect on the measurement results can be eliminated and the reliablility of the measurements improved as compared to the prior art measurements. In addition, it is easier to find out the real load on the transistor of the output stage during the transmission, whereby the adjustment of the optimum operation point of the transistor becomes more accurate in varying operating conditions.

FIGS. 4a–4e show some simulation results with the simulation coupling of a preferred embodiment of the invention according to FIG. 3. In the figures, a dashed line depicts the measured output power $P_{dc}$, and a solid line a theoretical, calculated output power $P_{out}$ on the basic frequency. The powers have been shown as a function of the input power $P_{in}$. The difference between the figures is the load impedance Z used in the simulation, the values of which in different simulations are as shown in Table 1. It can be clearly seen from the figures that both the measured and the calculated power are close to each other. The differences are mainly due to the fact that the measured power $P_{dc}$ is the total power, inclusive of the harmonic frequencies, which are not included in the theoretical power value $P_{out}$.

As was mentioned above in connection with the description of the coupling shown in FIG. 3, the high frequency currents and voltages of the transistor T1 are also measured in addition to the power. The measurements of the voltages and currents of the transistor are of great importance with regard to the maintenance of optimum operation conditions of the transistor. In power transistors, in particular, the load variations have a direct effect as variations of currents and voltages. Strong variations of voltage and current cause distortion in the signal and can even destroy the transistor.

An example of a situation in which strong voltage and current variations can be formed in the power transistor is when a mobile station without an accumulator is connected to a charging device, and the antenna is possibly carelessly set on its place. In a transmitter according to the present invention, the voltage and current measurement information can be used to adjust the operation point of the transistor, whereby the signal is distorted less and the destruction of the transistor of the output stage can be avoided.

Another example in which large voltage and current variations are possible is a situation in which a bipolar transistor is loaded with a load of a small impedance. Very strong current variations are then formed in the transistor, and in the long run these variations reduce the reliability of the transistor. In these situations, the measurement method according to the invention also prevents the disadvantages mentioned.

FIGS. 5a–5e show both the theoretical and the measured voltage values of the collector-emitter junction of the transistor in a coupling according to FIG. 3. In the figures, a solid line is used to depict the calculated RMS value $V_{calc}$ of the high-frequency voltage of the collector-emitter junction of the transistor T1. A dashed line is used to depict a rectified and low-pass filtered voltage $V_{meas}$, which is a good estimate of the high-frequency voltage of the collector-emitter junction of the transistor T1. Corresponding measurement results could also be formed by using a peak detector instead of a rectifier RECT1. It can be seen from the FIGS. 5a–5e that the measured values very accurately correspond to the calculated values, which means that the measurement is very reliable. It can also be seen from the figures that with loads that are active and have a high impedance, the collector-emitter voltage of the transistor increases as compared to the optimum, resistive load of 6 Ω.

Similarly, the simulation results of the high-frequency emitter current of the transistor T1 have been shown in FIGS. 6a–6e, in which a solid line is used to depict the calculated current $I_{calc}$, and a dashed line is used to depict the measured current $I_{meas}$. The impedance values used are the same as in the previous figures, in accordance with Table 1. Large current variations can be seen in FIG. 6b, where the impedance used was a resistive load of 2 Ω, and in FIG. 6e, where the load impedance was 3.6+4.8 Ω.

A further advantage of the invention is the fact that the measurement results of the high-frequency current and voltage can be used to estimate the real load impedance of the output stage transistor T1. The absolute value of the load impedance is proportional to the relationship between the measured voltage and current: $V_{meas}/I_{meas}$, and the term cos (Φ) is proportional to the formula $P_{dc}/(I_{meas} \times V_{meas})$. These results are shown in the FIGS. 7a–7e.

The blocks of the block diagram of the preferred embodiment of the invention according to FIG. 3 are well known, and numerous examples of them are found in the literature dealing with this technology.

In some practical applications, the transistor T1 of the output stage can be implemented by means of several parallelly connected transistors for achieving a sufficient output power. Then the voltage is measured as described above, and the current is measured at the emitter of one of the transistors. In this case, the current measurement result must be multiplied by the number of the parallelly connected transistors. This can preferably be implemented in a manner such that the amplification of the second differential amplifier A2 is set correspondingly; for example, when three transistors are used, the amplification is set as triple compared to an application implemented by one transistor.

Figure 8:
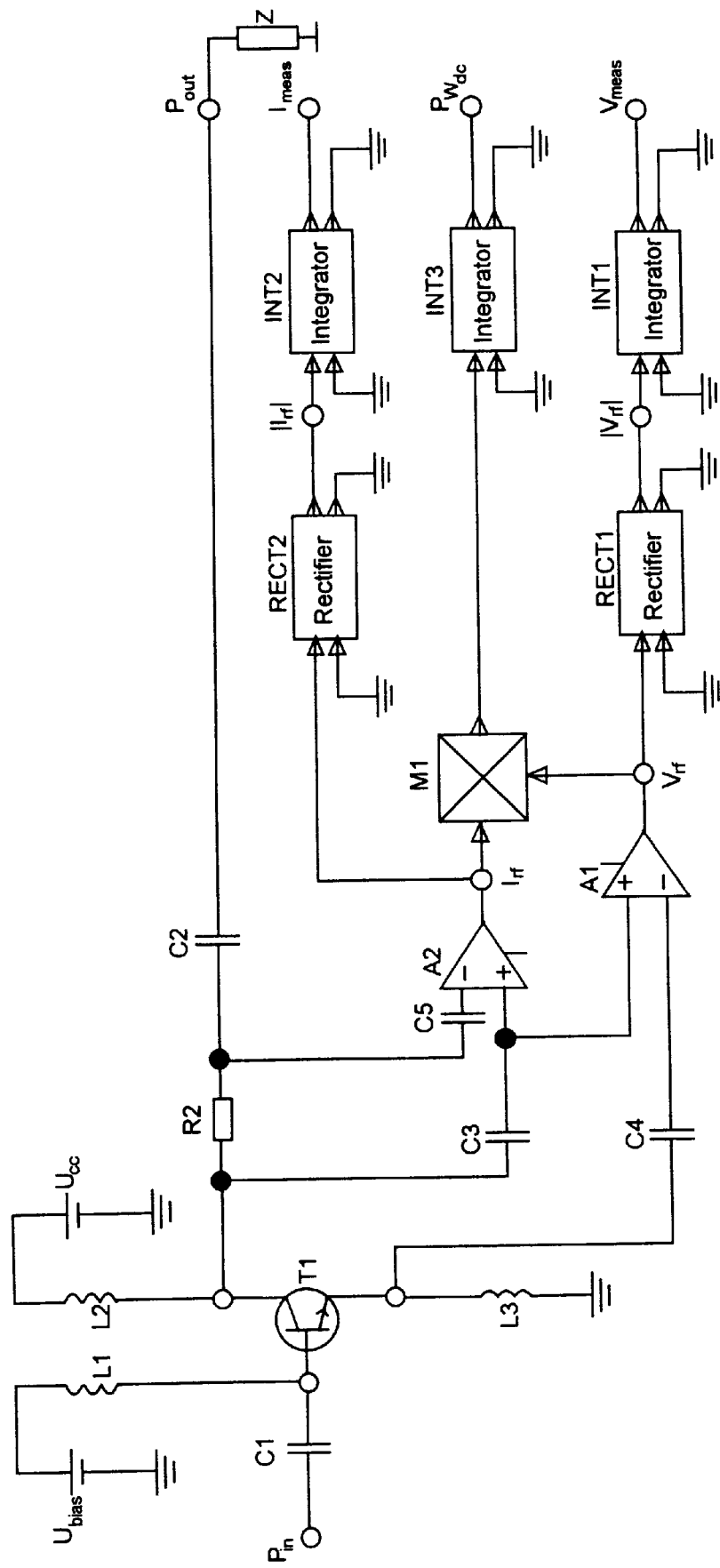
FIG. 8 shows another preferred embodiment of the invention.

FIG. 8 shows a second preferred embodiment of the invention as a simplified block diagram. The difference compared to the embodiment shown in FIG. 3 is primarily that the current measurement is carried out by means of a second resistor R2 connected to the output line of the output stage. The voltage and current measurement results are dealt with as has been described in connection with the embodiment of FIG. 3.

Current sensing is also possible using other current sensors such as transformers. As was already mentioned above, peak detectors can be used in place of rectifiers RECT1, RECT2.

The measurements described above should be placed as near to the power transistor T1 of the output stage as possible, whereby the measurement coupling is preferably integrated to the same semiconductor chip as the power transistor. Among other things, this has the advantage that the transmission paths of the signals can be made as short as possible, which reduces the interaction between the signal paths. In applications in which the frequencies of the high-frequency signals used are not very high, separate components can also be used to implement the measurement coupling.

Figure 9:
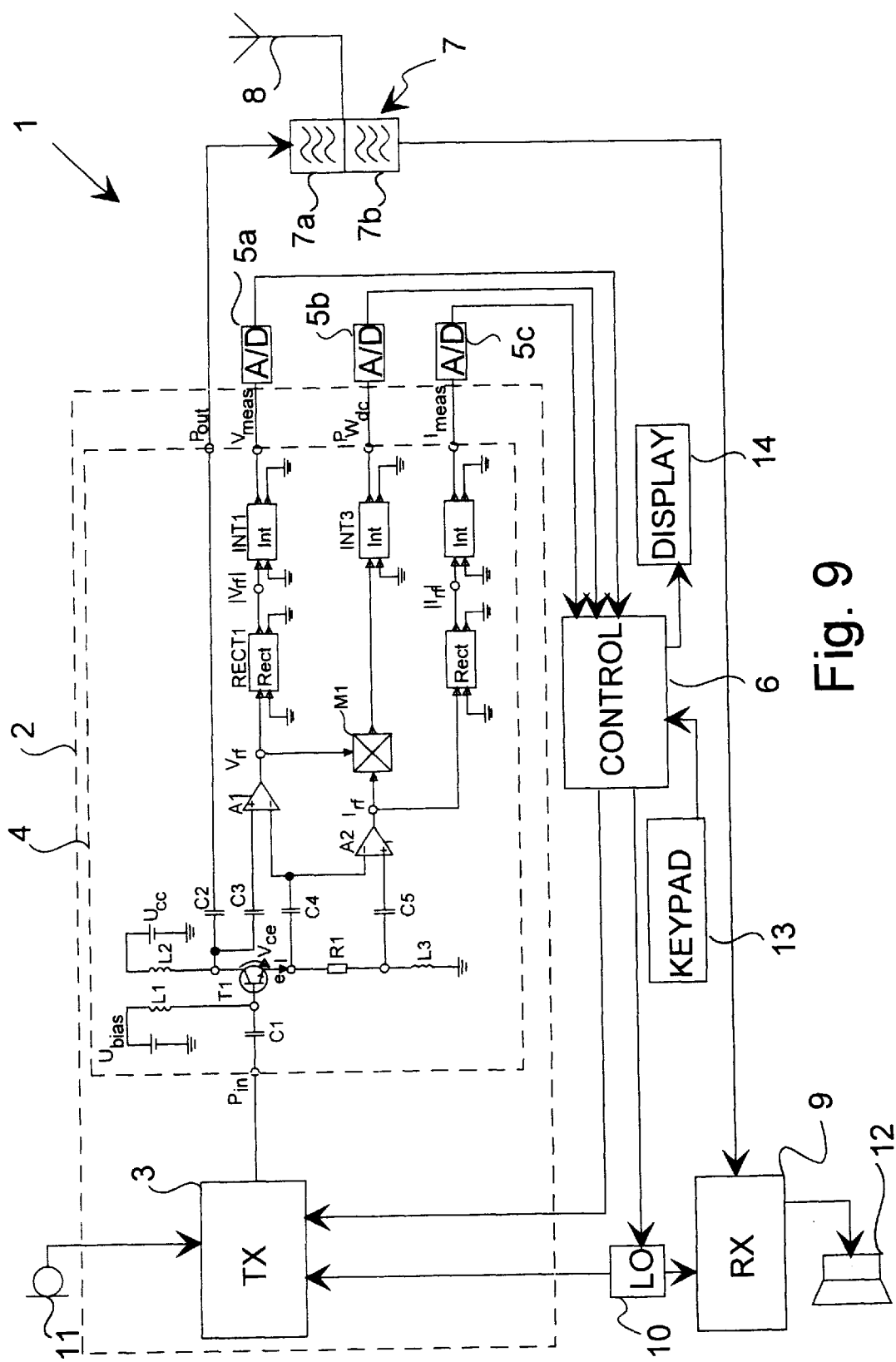
FIG. 9 shows a mobile station according to the invention.

FIG. 9 shows a mobile station 1 according to the present invention as a simplified block diagram. The mobile station 1 can be, for example, a GSM mobile station. In the modulation block 3 of the transmitter 2 a high-frequency signal is formed, to which the signal transmitted thereto, such as the signal of the microphone 11, has been modulated. The high-frequency signal is directed to the pin $P_{in}$ of the output stage 4. In this example, the output stage 4 corresponds to an output stage according to FIG. 3. The high-frequency signal is further directed via the first capacitor C1 to the base of the transistor T1 of the output stage for amplification. The transistor T1 can be, for example, a bipolar transistor, which has sufficient power endurance and high frequency properties for the application used at the time. The operating point of the transistor T1 is set correct by means of a biasing voltage directed to the base of the transistor T1. The biasing voltage is formed by the biasing voltage source $U_{bias}$ and conveyed via the first choke L1.

The high-frequency signal to be transmitted and conveyed to the base of the transistor T1 is amplified in the transistor T1, whereby an amplified, high-frequency output signal is received from the collector, which signal is directed via a second capacitor C2 to the load impedance Z. The load impedance preferably comprises an antenna and adapting means for achieving an optimum adaptation between the collector circuit and the antenna. In addition, the adaptation circuit can comprise a band-pass filter, which is used to attenuate spurious transmissions.

The operating voltage needed by the transistor T1 is directed to the collector of the transistor T1 via a second choke L2.

The emitter circuit of the transistor T1 preferably comprises a resistor R1 and an earth stray inductance L3.

The high-frequency alternating voltage of the collector-emitter junction of the transistor T1 is preferably measured in a manner such that a voltage signal is directed from the collector via a third capacitor C3 to the positive input line of the differential amplifier A1, and the alternating voltage of the emitter of the transistor T1 is directed via the fourth capacitor C4 to the negative input line of the first differential amplifier A1. Thus a voltage $V_{rf}$, proportional to the high-frequency collector-emitter voltage $V_{CE}$, is received from the output of the first differential amplifier A1.

The high-frequency emitter current $I_E$ of the transistor T1 can be determined by measuring the voltage over the resistor R1, as has been described above in connection with the description of FIG. 3. This voltage is measured by directing the emitter voltage of the transistor via the fourth capacitor C4 to the negative input line of the second differential amplifier A2, and the voltage on the side of the earth stray inductance of the resistor R1 via the fifth capacitor C5 to the positive input line of the second differential amplifier A2. Thus the second differential amplifier A2 forms a voltage signal proportional to the emitter current of the transistor T1, which signal is here denoted by $I_{rf}$.

In the first rectifier RECT1, an absolute value $|V_{rf}|$ is formed from the signal $V_{rf}$, proportional to the voltage, and integrated in the first intergrator INT1, resulting in a voltage $V_{meas}$ proportional to the mean value of the collector-emitter voltage of the transistor T1. An absolute value $|I_{rf}|$ is formed in the second rectifier RECT2 from the voltage $I_{rf}$ proportional to the emitter current. The rectified voltage is further integrated in the second integrator INT2, whereby a voltage $I_{meas}$, proportional to the mean value of the emitter current, is received from the output of the second integrator.

The real average power formed by the transistor T1 is found out by multiplying the voltage values by the current values advantageously in a manner such that the output signal of the first differential amplifier A1 and the output signal of the second differential amplifier A2 are directed to a multiplier circuit M1, such as a mixer. The multiplier circuit M1 forms a signal proportional to each instantaneous power, which signal is integrated in the third integrator INT3 for forming a voltage $P_{dc}$ proportional to the mean value of the real power.

The measurement results are converted by analog-to-digital converters 5a, 5b, 5c to digital form and directed to the control unit 6 of the mobile station, such as a microcontroller. The application software of the control unit 6 includes a program in which the measurement results are processed in order to determine, among other things, whether the transmission power must be reduced due to a change in the load impedance of the output stage 4, for example.

If the transmission power must be adjusted, the control unit 6 forms an adjustment signal for the modulation block 3 of the transmitter, whereby the power of the output signal of the modulation block 3 is reduced, which in turn reduces the output power of the output stage 4.

From the output stage 4, the amplified high-frequency signal is directed via a duplex filter 7 to the antenna 8. A certain frequency band is reserved for the use of each mobile station system. This frequency band is usually divided into uplink and downlink frequency bands, which means that the transmission of the mobile station 1 to the base station (not shown) takes place at a different frequency from the base station transmission to the mobile station 1. The duplex filter 7 includes a first band-pass filter 7a, the passband of which comprises the transmission frequency band of the mobile station system, and a second band-pass filter 7b, the passband of which comprises the reception frequency band of the mobile station system. Thus the high-frequency signals from the transmitter do not disturb the operation of the receiver, because they do not substantially pass through the second band-pass filter 7b.

The high-frequency signals to be received are directed from the antenna 8 via the second band-pass filter 7b of the duplex filter 7 to the receiver 9, which is, for example, a prior art mobile station receiver. In the receiver 9, the received signal is demodulated and directed to the earphone 12.

The local oscillator frequencies of the transmitter 2 and the receiver 9 are generated by the local oscillator 10, the frequency of which is controlled by the controller 6. The mobile station 1 in FIG. 9 also comprises a keypad 13 and a display 14.

The present invention is not limited to the above described embodiments only, but it can be modified within the scope defined by the attached claims.

What is claimed is:

1. A transmitter for communication devices, which comprises:
a high-frequency power amplifier for amplifying the high-frequency signal to be transmitted, which high-frequency power amplifier comprises a transistor with a collector-emitter voltage and an emitter current, and an output stage (4) for giving an amplified high-frequency signal, and measuring devices for measuring the power of the high-frequency signal comprising:
high-frequency voltage measuring devices and current measuring devices for measuring the voltage and current of the high-frequency signal in said output stage, and
high frequency power measuring devices for calculating the power of the high-frequency signal on the basis of the measured high-frequency voltage and high-frequency current, and wherein
the high-frequency voltage measuring devices comprise a first differential amplifier for forming a measurement signal proportional to the high-frequency collector-emitter voltage, a first rectifier for forming the absolute value of the measurement signal proportional to the collector-emitter voltage, and a first integrator for forming a measurement signal proportional to the mean value of the collector-emitter voltage of the transistor,
the high-frequency current measuring devices comprise a second differential amplifier for forming a measurement signal proportional to the high-frequency emitter current, a second rectifier for forming the absolute value proportional to the emitter current and a second integrator for forming a measurement signal proportional to the mean value of the emitter current of the transistor, and
the measuring devices of the high-frequency power comprise a third integrator and a multiplier circuit for forming and inputting to said third integrator a measurement signal proportional to each instantaneous power by multiplying the high-frequency measurement signal proportional to the collector-emitter voltage by the high-frequency measurement signal proportional to the emitter current for forming a measurement signal proportional to the mean value of the power output of the third integrator.

2. A transmitter according to claim 1, wherein said measurement signals are analog signals.

3. A transmitter for communication devices, comprising:
a high-frequency power amplifier comprising an amplifying component having an input port for receiving a high-frequency signal to be transmitted and an output port for outputting an amplified high-frequency signal to be transmitted, first measurement means, being at least partly coupled between said input port and said output port of said amplifying component, for generating a first indication describing the voltage of said amplified high-frequency signal in said high-frequency power amplifier, second measurement means, being at least partly coupled between said input port and said output port of said amplifying component, for generating a second indication describing the current of said amplified high-frequency signal in said high-frequency power amplifier, and calculating means for calculating the power of the amplified high-frequency signal in said high-frequency power amplifier based on said first indication and said second indication from between said input port and said output port of said amplifying component.

4. A mobile station, which includes a transmitter for transmitting signals, which transmitter comprises:

a high-frequency amplifier for amplifying the high-frequency signal to be transmitted, which high-frequency amplifier includes an amplifying component for producing an amplified high-frequency signal, and measuring devices for determining the power of the amplified high-frequency signal, wherein the measuring devices comprise:

first means for measuring the voltage and the current of the amplified high-frequency signal in the high-frequency power amplifier, said first means being at least partly coupled to two sides of said amplifier component to separately measure said voltage and current, and second means for calculating the power of the amplified high-frequency signal based on the separately measured voltage and current of the amplified high-frequency signal.

5. A mobile station according to claim 4, wherein said station is a GSM mobile station.

6. A transmitter for communication devices, which comprises:

a high-frequency power amplifier for amplifying the high-frequency signal to be transmitted, which high-frequency power amplifier comprises an amplifying component for producing an amplified high-frequency signal, and measuring devices for determining the power of the amplified high-frequency signal, wherein the measuring devices comprise:

first devices for measuring the voltage and current of the amplified high-frequency signal in the high-frequency power amplifier, said first devices being at least partly coupled to two sides of said amplifier component to separately measure said voltage and current, and second devices for calculating the power of the amplified high-frequency signal based on the separately measured voltage and current of the amplified high-frequency signal.

7. A transmitter according to claim 1, further comprising a load impedance coupled to the amplified high-frequency signal, and wherein said second devices calculate the load impedance based on the measured voltage and current of the amplified high-frequency signal.

8. A transmitter according to claim 1, wherein the amplifying component comprises an amplification means in which the high-frequency signal is amplified, and said second devices.

9. A transmitter according to claim 8, wherein the amplification means is implemented by one transistor and the voltage of the amplified high-frequency signal is arranged to be measured between the collector and emitter of the one transistor and the current is arranged to be measured at the emitter circuit of the one transistor.

10. A transmitter according to claim 8, wherein said first devices comprise at least a first and a second differential amplifier means coupled to said amplification means and wherein the amplification means is implemented by two or more transistors and the voltage of the amplified high-frequency signal is arranged to be measured between the collector and emitter of one transistor and the current is arranged to be measured at the emitter circuit of said one transistor, and wherein the amplification of the second differential amplifier means is proportional to the number of transistors used in the amplification means.

11. A transmitter according to claim 10, wherein:

the first and the second differential amplifier means of said first devices comprise:

a first differential amplifier for forming a measurement signal proportional to the high-frequency collector-emitter voltage of said one transistor, a first rectifier for forming the absolute value of the measurement signal proportional to the collector-emitter voltage of the one transistor, and a first integrator for forming a measurement signal proportional to the mean value of the collector-emitter voltage of the one transistor, and a second differential amplifier for forming a measurement signal proportional to the high-frequency emitter current a second rectifier for forming the absolute value proportional to the emitter current and a second integrator for forming a measurement signal proportional to the mean value of the emitter current of the one transistor (T1), and the second devices comprise a multiplier circuit for forming a measurement signal proportional to each instantaneous power by multiplying the high-frequency measurement signal proportional to the collector-emitter voltage by the high-frequency measurement signal proportional to the emitter current for forming a measurement signal proportional to the mean value of the power of the third integrator.

12. A transmitter according to claim 11, wherein the measurement signal proportional to the high-frequency collector-emitter voltage of said one transistor, the measurement signal proportional to the high-frequency emitter current, the measurement signal proportional to the mean value of the collector-emitter voltage of the one transistor, the measurement signal proportional to the mean value of the emitter current of the one transistor, and the measurement signal proportional to the mean value of the power of the third integrator, are analog signals.

13. A transmitter according to claim 12, wherein said analog measurement signals are arranged to be used for adjusting the operating point of the amplifier component.

* * * * *